United States Patent [19]

Kuchta

[11] 3,754,920

[45] Aug. 28, 1973

[54] PHOTOPOLYMERIZABLE ELEMENTS OF LOW OPTICAL DENSITY CONTAINING THICKENERS WITH DISCRETE, ORDERLY ORIENTATION

[75] Inventor: August Dennis Kuchta, East Brunswick, N.J.

[73] Assignee: E. I. du Pont de Nemours and Company, Wilmington, Del.

[22] Filed: Apr. 30, 1971

[21] Appl. No.: 139,280

Related U.S. Application Data

[63] Continuation-in-part of Ser. No. 762,627, Sept. 25, 1968, abandoned.

[52] U.S. Cl. .................... 96/87 R, 96/28, 96/35.1, 96/115 P

[51] Int. Cl. .................... G03c 1/68

[58] Field of Search .................... 96/35.1, 115 P, 87 R, 96/28

[56] References Cited

UNITED STATES PATENTS 3,353,955 11/1967 Colgrove .................... 96/28

*Primary Examiner*—Ronald H. Smith
*Attorney*—William R. Moser

[57] ABSTRACT

This invention relates to a photopolymerizable element for reproducing images. A photopolymerizable composition is coated on a support, dried, and laminated with a cover sheet. The composition contains a particulate micro-crystalline thickener and 10–90 parts of photopolymerizable monomer per 100 parts, by weight, of liquid monomer-thickener composition with an optical density in the actinic region not more than 0.6 and the dry coating thickness is at least 0.05 mil. The support and cover sheet have significantly different degrees of chemical affinity for the unexposed photopolymerizable layer. The cover sheet has the higher chemical affinity, and is placed preferably on the side opposite the exposure side. The element is imagewise exposed through the support resulting in an increase of adhesion of the exposed photopolymerizable layer to support and cover sheet but with the greatest increase in adhesion being to the cover sheet. The support and cover sheet are delaminated, the polymerized material adhering to the cover sheet, the unpolymerized material remaining on the support. The unpolymerized image may then be transferred to a receptor by first laminating it to the receptor and then applying pressure at room temperature. This photographic element and process are usable in color proofing.

10 Claims, No Drawings

PHOTOPOLYMERIZABLE ELEMENTS OF LOW OPTICAL DENSITY CONTAINING THICKENERS WITH DISCRETE, ORDERLY ORIENTATION

CROSS REFERENCES TO RELATED APPLICATIONS

This application is a continuation-in-part of application Ser. No. 762,627, filed Sept. 25, 1968, now abandoned.

BACKGROUND OF THE INVENTION

1. Field of the Invention

This invention relates to the art of photography and more particularly to the art of image reproduction wherein images are formed by photopolymerization and thermal transfer.

2. Description of the Prior Art

There are various film elements useful for producing a copy of an image by photopolymerization techniques. Colgrove, U.S. Pat. No. 3,353,955 issued Nov. 21, 1967, discloses a photopolymerizable layer laminated between two materials, namely, a support and a cover sheet. The element is exposed imagewise through the support or cover sheet, and light is transmitted through the clear background areas of the process image, exposing particular areas of the photopolymerizable layer, causing these areas to harden and adhere to the support or cover sheet through which exposure was made. The cover sheet and support are delaminated, and the sheet through which the exposure was made bears a negative image of exposed and hardened polymer, leaving behind on the other sheet a complementary unpolymerized positive image of the original design. This system is characterized as follows: (*a*) the optical density of the photopolymerizable layer must be high (i.e., greater than 0.8) so as to prevent light from completely penetrating and photopolymerizing the layer, (*b*) the polymerized material preferentially adheres to the side that has been exposed and forms a negative image thereon, (*c*) after exposure and delamination, no part of the system is capable of pressure transfer, and (*d*) one support must be modified by having a matte surface. The present invention is the exact opposite of that of Colgrove in all of the above respects, since it requires a low optical density (i.e., not more than 0.6) so as to allow light to completely penetrate and photopolymerize the layer, which upon delamination forms a positive image on the side that has been exposed and a negative image of polymerized material on the opposite side. This difference results from the optical density and polymer-to-support affinities of the photopolymerizable element of the invention. In addition, a matte surface is unnecessary and pressure transfer at room temperature of the unpolymerized negative image on the exposure side is possible after delamination.

Chambers, U. S. Pat. No. 3,525,615, issued Aug. 25, 1970, discloses a photopolymerizable element and process of using it. Chambers employs an ethylenically unsaturated photopolymer composition and a photoinitiator in addition to an inorganic thixotropic binder. The element is exposed imagewise, and image ttransfer is achieved by placing the element in intimate contact with an image receptive support. Direct force is then applied to the laminated structure causing liquefaction of the photopolymerizable material in the unexposed areas and transfer to the receptor is achieved.

Heiart, U.S. Pat. No. 3,202,508, issued Aug. 24, 1965 discloses photopolymerization and image transfer at room temperature but relies on pressure to provide cohesive failure between the polymerized and unpolymerized material to searate the positive from the negative image. The processes of Chambers and Heiart present problems in maintenance of dimensional fidelity. Furthermore, the transferred image remains tacky and special precautions must be taken so that the unpolymerized transferred image is not destroyed or distorted.

The above patents and applications relate to a photopolymerizable system and involve formation or reproduction of images by transfer. The present invention is similarly related, however, it is concerned with providing a new and improved product, particularly useful for colorproofing. The product is characterized as having a thin photopolymerizable layer with a low optical density permitting complete polymerization of the photopolymerizable layer, coupled with a low cohesive property, provided in part by the thickener of discrete, orderly orientation permitting easy separation of the polymerized and unpolymerized image areas. This photopolymer layer is coated between two supports having different chemical attractions for the photopolymer layer so that after exposure the polymerized area is attracted to the interface having the greater chemical affinity so that on delamination of the supports the image areas separate. The unpolymerized area may then be transferred to a receptor. This permits the transfer of multiple images of complementary colors to be superimposed on one image receptor and thereby providing a system for colorproofing.

SUMMARY OF THE INVENTION

A photopolymerizable element useful for image reproduction comprising: a laminated element having a solid photopolymerizable layer intercalated between two sheet supports, said photopolymerizable layer having a coating thickness (when dry) of at least 0.05 mil, containing a liquid, ethylenically unsaturated monomer with at least one terminal ethylenic group capable of forming a high polymer by free radial initiated and chain-propagated, addition polymerization and having an optical density to actinic radiation of not more than 0.6 admixed with a particulate thickener material having discrete and orderly orientation, the monomer is present in the amount of 10–90 parts of monomer per 100 parts, by weight, of monomer-thickener composition, while the supports are characterized as having different surface chemical affinities to the photopolymerizable layer resulting in different adhesive responses to polymerized and unpolymerized materials whereby on exposure the polymerized material adheres to the support having the higher chemical affinity for the photopolymerized material and the unpolymerized material adheres to the support having the lower chemical affinity for the polymerized material producing a positive and a negative image.

Thus, there is provided an element which is delaminatable after imagewise exposure to yield a negative image of unpolymerized material on the support through which exposure was made and a positive image of polymerized material on the other support. That is, the element of the invention may be imagewise exposed and delaminated so as to yield a negative image of unpolymerized material on the support through which exposure was made and a positive image of polymerized material on the other support.

Once the photopolymerizable element has been exposed and delaminated it may be used in an image reproduction process. In the process of image reproduction (*a*) the photopolymerizable film element is imagewise exposed to actinic radiation, (*b*) the supports are delaminated whereby the polymerized material adheres to the support having the higher chemical affinity and the unpolymerized material adheres to the support having the lower chemical affinity producing a positive and a negative image.

A receptor may be laminated to the unpolymerized material, pressure applied to the receptor in contact with the unpolymerized material effectuating a transfer of the unpolymerized material to the receptor. The receptor may then be delaminated and it will contain the unpolymerized image. The unpolymerized image on the receptor paper may now be post-exposed to harden it.

DETAILED DESCRIPTION

It has been found that a photopolymer composition having a liquid, ethylenically unsaturated liquid monomer with at least one terminal ethylenic group capable of forming a high polymer by free radical initiated, chain-propagating addition polymerization and a particulate thickener material having discrete and orderly orientation where the monomer is present in the amount of 10–90 parts of monomer per 100 parts, by weight, of monomer-thickener composition with the total composition having an optical density in the actinic region equal to or less than 0.6 when coated onto a film support and the layer dried to a thickness of at least 0.05 mils has little interfacial adhesion to the support in the unpolymerized state and low cohesion. When such a photopolymer layer is on a support and a cover sheet is laminated to the surface of the photopolymer layer, where the support is characterized as having a lower chemical affinity for the photopolymer layer than the cover sheet, the interfacial adhesion between the support and photopolymer layer is greater than the interfacial adhesion between the cover sheet and the photopolymer layer prior to exposure. This is due to the fact that when the photopolymer is coated on to the support it is in a liquid state and flows into the irregular surface contours of the support, thereby, actually contacting much more surface area than the surface to photopolymer contact resulting from the lamination of the cover sheet onto the dried photopolymer. Therefore, although the photopolymer actually has a smaller adhesion attraction for the support it will preferentially adhere to the support, prior to exposure, because the overall adhesive force is greater. But, a reversal of adhesive preference occurs to the photopolymer layer when it is exposed through the support to actinic radiation. The exposed photopolymer will adhere to the cover sheet which has the higher chemical affinity for the photopolymer layer. In this manner a system is created where, on delamination of the cover sheet from the support after imagewise exposure through the support the exposed polymerized material separates from the unpolymerized material by adhering to the cover sheet while the unpolymerized material adheres to the support. Once the polymerized material is peeled apart from the unpolymerized material, the unpolymerized material left on the support is capable of transferring to another surface, such as a receptor paper by laminating the unpolymerized material to the receptor paper applying pressure, then delaminating the original support.

The film structure may be made in the following manner. The photopolymerizable composition may be made up of an ethylenically unsaturated compound containing at least one terminal ethylenic group as exemplified by the monomers described in Plambeck, U.S. Pat. No. 2,760,863, Celeste and Bauer, U.S. Pat. No. 3,261,686, issued July 19, 1966, and especially the polyol polyesters of Cohen and Schoenthaler, U.S. Pat. No. 3,380,831, issued Apr. 30, 1968. The ethylenically unsaturated monomer should have a molecular weight of at least 150 and be non-volatile at room temperature and be present in the ratio of from 10 to not more than 90 parts of monomer per 100 parts, by weight, of monomer-thickener composition. The thickeners useable in this system may be either organic thickeners giving discrete orientation to the photopolymer layer, or inorganic thickeners having a preferred particle size no greater than 0.1 mil.

The type of thickener chosen is significant from the standpoint that the thickener controls the degree of cohesion imparted to the photopolymer layer. The cohesive properties of the unpolymerized material must be low if the adhesive forces are small. This is important if a clear sharp image is to be obtained when the polymerized material is separated from the unpolymerized material on delamination of the support and cover sheet after exposure. If an inorganic thickener is chosen in which the molecular orientation is discrete and orderly, a clean sharp breakage is achieved when the polymerized material is peeled apart from the unpolymerized material. Inorganic thickeners which fall into the category of particulate micro-crystalline materials are silicas, clays, alumina, bentonites, kaolinites, attapulgites and montmorillonites. Organic thickeners may also be used but if their structure is fibrous they will impart a high cohesive property to the photopolymer layer which causes the material to be somewhat elastic resulting in a tearing action when separating the polymerized from the unpolymerized material by delaminating at room temperature. When tearing occurs in the photopolymer layer during delamination, a blurred and distorted image is obtained. Useable organic thickeners include: microcrystalline celluloses which impart discrete orientation permitting clean breakage of polymerized from unpolymerized material.

The photopolymer composition may also contain a pigment or dye to serve as a colorant, usually present in the amount of 1–60 parts of pigments per 100 parts of monomer thickener composition. Some of the pigments which may be used are: the inorganic pigments such as clays, oxides of metals or synthetic organic materials which are insoluble in the medium in which they are dispersed. The pure organic compounds known as toners and the diluted organic pigments prepared by adsorbing a dye on a metallic hydroxide known as lakes may also be used. Suitable toners include the organic azo compounds and organic azine compounds while suitable lakes may be obtained by the use of the rhodamine pigments.

In addition a photoinitiator is used to start monomer polymerization which may be activated by actinic radiation and is present in the amount of 0.001 to 10 parts by weight of the monomer. Particulate material may also be added to photopolymer composition but the photopolymer stratum before exposure must have an optical density equal to or less than 0.60 in the actinic region.

To prepare the photopolymerizable composition the various ingredients are mixed together in their proper ratios and may be either milled in a ball mill for a period of time, usually 16 hours, or mixed by rapidly stirring the composition for 1 hour.

The prepared photopolymer is coated to a support, dried and a cover sheet is then laminated to the exposed photopolymer. The preferred coating thickness is at least 0.05 mil. Lamination is carried out at room temperature under a pressure of 25–100 psi. A significant aspect of this invention is the proper selection of base and cover sheet used to sandwich the photopolymer layer. The important property sought is the adhesive quality between the photopolymer layer and the support on one side and the cover sheet on the other. The selection of support and cover sheet to give the desired adhesive quality needed is made by balancing the chemical affinities of the two supports for the polymer layer. It has been found that the degree of chemical affinity which determines the reactivity of the surface of the support with the photopolymer layer is highly dependent on the polarity of the support. A low chemical polarity means little reactivity of the surface while a high chemical polarity means that the surface has a high degree of chemical reactivity (especially hydrogen bonding) when the surface molecules of the support carry a high dipole moment. When the monomer in the photopolymer layer is polymerized to create a polymer, the dipole properties of the molecules change resulting in increased molecular reactivity from formed carboxyl and active hydrogen groups. Therefore when a photopolymer layer is exposed and the monomer converted to a polymer while the photopolymer layer is laminated to a highly polar material on one side and a relatively non-polar support on the other the result is that the two reactivity centers of the polar base and the polymerized monomer interact to create a strong adhesive bond. A certain amount of reactivity also occurs between the polymerized material and the relatively nonpolar base, however, when the degrees of polarity of the two supports are diverse enough the polymerized areas will preferentially adhere to the more polar support.

One method of showing the different degrees of the chemical affinity of various supports to a liquid is to compare their relative contact angles. Following, in tabulated form, are samples of various surfaces where the contact angle has been measured by placing ethylene glycol on the surface and measuring the contact angle of ethylene glycol with the surface by a Gaertner goniometer.

| Sample No. | Surface | Contact angle in degrees |
|---|---|---|
| 1 | Polyethylene-untreated, 1-mil thick | 68 |
| 2 | Polypropylene-untreated, 1½ mil | 64 |
| 3 | Polypropylene-treated for printability,(flame treated surface) 1¼-mil | 53 |
| 4 | Polyethylene terephthalate-untreated, 1-mil | 45 |
| 5 | Polyethylene terephthalate-resin subbed, ¾-mil | 21 |
| 6 | Polyethylene terephthalate-aluminized, 2-mil | 36 |
| 7 | Polyethylene terephthalate-untreated, 2-mil | 48 |

The data above shows that as the surface free energy or chemical polarity increases, the contact angle decreases, thus improving the wettability of the liquid to the surface. For best results the base support-laminate combination is chosen so that their contact angles with ethylene glycol are very difficult. The best combination from the above values shows that one support ought to be 1-mil thick untreated polyethylene of Sample 1 combined with resin subbed polyethylene terephthalate of Sample No. 5. The resin sub was a vinylidene chloride/methyl acrylate/itaconic acid copolymer as described in Alles U.S. Pat. No. 2,779,684. This simple technique gives relative values which are sufficient to predict which supports are suitably matched as base and cover sheet in the photopolymer peel-apart systems of this invention.

Useable supports which may be classed according to their relative degrees of polarity and contact angle are (*a*) nonpolar, high contact angle-polyethylene, polypropylene, and tetrafluoro ethylene, (*b*) polar, low contact angle-polyvinyl acetate, cellulose triacetate, copolymers of acrylates with unsaturated anhydrides and phenol formaldehyde resins. Compositions which fall between these two classes are medium polarity-polystyrene and polymerized trifluoro ethylene.

In line with creating a reactive surface on the film support it is recognized that this may be accomplished by processing the surface. For example, the surface may be exposed to an electrical discharge after the manner described in Traver, U.S. Pat. No. 3,113,208 or exposed to an air/propane flame after the manner described in Bryan, U.S. Pat. No. 3,145,242 or a nonpolar support such as polyethylene may be coated with a resin copolymer thereby increasing the polarity of the resin surface on the support.

When the support and the cover sheet are chosen so that the support is relatively nonpolar and the cover sheet is relatively polar the polymerized material (which is generally of a polar nature) in the photopolymer element will preferentially adhere to the polar support irrespective of whether exposure is made through the cover sheet or through the base support provided the support on the exposure side admits sufficient actinic radiation to completely polymerize the photopolymer layer in the exposed region.

One of the supports may comprise a metallized polymeric film, as described for example in "Modern Plastics Encyclopedia, 1968," page 570. Metallized, and particularly, aluminized, polyethylene terephthalate films are preferred. Such films and their manufacture are described in Canadian Patent No. 556,575, issued Apr. 29, 1958. As described therein, composite polyethylene terephthalate material is provided comprising a film of polyethylene terephthalate having an adherent metallic coating on one or both surfaces thereof. A biaxially stretched and heat-set film of polyethylene terephthalate material is preferably employed. Generally, the thickness of the metallic coating should be at least 0.0001 mil and, preferably, from about 0.0004 to about 0.0008 mil; but thicker coatings may be applied. Furthermore, coatings thinner than 0.0001 mil may be applied for producing a coated film which is translucent and will transmit light. The metallic element applied to the film may be any one of the useful metals such as aluminum, zinc, silver, gold, lead, cobalt, platinum, tungsten, tantalum, molybdenum, nickel, and chromium.

With respect to the various techniques of applying a metallic coating to polyethylene terephthalate film, there are four important methods which may be employed, namely: vacuum metallizing, electroplating, chemical reduction of silver nitrate, and electrostatic spraying. Preferably, the film is coated with aluminum by evaporating the metal onto the film surface by procedures well known in the art of vacuum metallizing.

Complete polymerization of the photopolymer layer is assured if the transmission optical density in the actinic region is no greater than 0.6. The term transmission optical density is used to mean a measurement of the opacity of the photopolymer layer to actinic radiation. As a mathematical expression of optical density the intensity of incident light ($I_o$) is related to the intensity of transmitted light ($I_t$) in the following manner. Log $I_o/I_t$ is equal to abc/2.3 where $I_o$ is equal to the intensity of incident light, $I_t$ is equal to the intensity of transmitted light, *a* is equal to the extinction coefficient of absorbent, *b* is equal to the thickess of the photopolymer layer and *c* is equal to the concentration of initiator or absorbent. The theory behind this formula is discussed in Mees, "The Theory of Photographic Processes," the Macmillian Co., New York (1954) pp. 816–817. A commercial instrument useable in measuring the optical density is a Cary Spectrophotometer, Model No. 14 MS manufactured by Varian Corp.

In the exposure step of this invention, an image forming photopolymer matrix may be exposed to ultraviolet or actinic radiation through the base or the cover sheet depending on the desired image orientation and type of initiator used. When it is desired to have an unpolymerized positive image remaining on the base support after exposure and lamination, a photographic process positive is used. The positive is placed on the base side and exposure is made through the base. If a photographic process negative is used the negative is placed against the cover sheet and exposure is made through the cover sheet. Imagewise exposure in the above described invention can be made through a stencil, line or halftone negative or positive, or other suitable transparency and can be either a contact or projection exposure. Alternatively, reflectographic exposure techniques may be employed. Sufficient imagewise exposure to actinic radiation is given until substantial addition polymerization takes place in the exposed areas to form an addition polymer and significantly less polymerization takes place in the underexposed areas. If it is desirable or necessary to use a base or alternatively a cover sheet which is relatively opaque to actinic radiation, exposure is then limited to the side transparent to actinic radiation. In such a situation the appropriate photographic process positive or negative must be chosen to give the desired result.

After the photographic element has been exposed imagewise, the cover sheet is delaminated and the polymerized material separated from the unpolymerized material with the polymerized material adhering to the cover sheet. Remaining on the support is the unpolymerized image. The unpolymerized image may be transferred to a suitable receptor by placing the unpolymerized material against the receptor, applying pressure then removing the support.

The pressure transfer step may be carried out by the use of devices such as pressure rollers, static pressure devices, pellet bombardment as described in Halpern, U.S. Pat. No. 3,244,777 (Apr. 5, 1966) a finger-pressure device described in Alles, U.S. Pat. No. 3,128,498 (Apr. 24, 1962) or a nail pad such as described in Nacci, U.S. Pat. No. 3,179,975 Apr. 27, 1968. Experiments have shown that at least 1000 pounds/sq.in. is needed before a complete transfer of material will occur. Optimum results were consistently obtained by using pressures in the range of 5000 to 7000 pounds/sq.in. Pressures above 10,000 pounds/sq.in do not add anything in way of perfecting the transfer-image and pressures approximating 15,000 pounds/sq.in. were found to be destructive to the materials used and distortion of the transferred image occurred.

The photopolymerizable film element of this invention is particularly useful in color proofing where multiple complementary images of different colors are to be superimposed on one receptor. This element may also be used in the process of making decalcomanias, surprinting or other situations where it is desirable to transfer or imprint an image on a receptor surface.

This invention will be further illustrated but is not intended to be limited by the following detailed examples.

EXAMPLE I

A photopolymerizable composition was prepared with the following ingredients:

| | Grams |
|---|---|
| Colloidal aluminum oxide - particle size 5 × 75 mμ | 30.0 |
| Trimethylolpropane ethylene oxide triacrylate adduct (Prepared according to Cohen U.S. 3,380,831, Apr. 30, 1968) | 70.0 |
| Sodium salt of napthalene sulfonate-formaldehyde adduct | 3.0 |
| Yellow toner pigment (benzidene yellow, CI No. 21090) | 12.0 |
| 2-Ethylanthraquinone | 1.5 |
| p-Methoxyphenol | 1.5 |
| Saponin | 1.5 |
| Water | 600.0 |
| Isopropanol | 55.0 |

These materials were placed in a ½-gal. porcelain ball mill containing 1000 g. of ½-inch diameter ceramic balls and milled for 20 hours. This dispersion was then reverse roll coated onto a 1-mil biaxially oriented polypropylene support. The coating was dried at 180°F. with a resulting thickness of 0.1-mil. Aluminized polyethylene terephthalate film 2-mil thick was laminated to the dried coating surface under a pressure of about 10 pounds/sq.in. with the aluminum side in contact with the coating.

The contact angle of the 2 supports was measured with a Gaertner goniometer using ethylene glycol as the wetting agent. The aluminized surface of the aluminized polyethylene terephthalate was 36° and the contact angle for the polypropylene was 64°. The thickness of the dried coating which is about 0.1 mil has an optical density of approx. 0.4 at a light wave length of 3400 angstroms as measured with a Cary Spectrophotometer.

The film element thus made was divided into 3 samples. Samples 1 and 2 were strips 1 inch wide and 10 inches long. Sample 1 received an overall exposure with a carbon arc for 20 secs. through the polypropylene support. Sample 2 did not receive an exposure. Both samples were delaminated and the force required to effectuate delamination was measured. 15 g. per inch were required to delaminate sample 1 while only 5 g. per inch were required to delaminate sample 2 as measured by an Instron machine manufactured by Instron Engineering Corp., Quincy, Mass. This demonstrates that the degree of adhesion increases with photopolymerization, furthermore, on sample 1 the exposed photopolymer adhered to the aluminized polyethylene terephthalate the support having the lower contact angle.

On sample 3 a photographic positive was placed in contact with the polypropylene support and an exposure was made using a carbon arc source for 20 secs. under vacuum. After imagewise exposure, the supports were delaminated and the hard exposed polymerized areas adhered to the aluminized polyethylene terephthalate support. The soft unpolymerized areas adhered to the polypropylene support. The unpolymerized image remaining on the polypropylene support may be hardened on the polypropylene by exposing it to ultraviolet light or it may be transferred to a receptor by placing the unpolymerized material in contact with the receptor, applying pressure and then delaminating the polypropylene support.

EXAMPLE II

A photopolymerizable composition was prepared with the following ingredients:

| | Grams |
|---|---|
| Colloidal aluminum oxide | 1.3 |
| Trimethylolpropane ethylene oxide triacrylate adduct | 5.0 |
| Alkyl sodium napthalene sulfonic acid adduct | 0.2 |
| Rhodamine pigment (CI No. 45160) | 0.5 |
| Phenanthrenequinone | 0.1 |
| p-Methoxyphenol | 0.1 |
| Saponin | 0.5 |
| Water | 40.0 |

These ingredients were placed in a 1-pint glass jar containing 100 g. of ½-inch diameter porcelain balls and milled 16 hours. The resulting dispersion was air knife coated onto a 1-mil polypropylene support and dried to a thickness of 0.1-mil. The optical density was 0.6 at 3800A. A 2-mil thick cover sheet of aluminized polyethylene terephthalate was laminated to the exposed surface of the photopolymer composition. The film element was then exposed and delaminated in the manner described in Example I. The resulting images were excellent.

EXAMPLE III

A photopolymerizable composition was prepared in the manner described in Example II except that the monomer trimethylolpropane ethylene oxide triacrylate adduct of Example II was replaced with polyethylene glycol diacrylate (mol. wt. 400). Coating, exposure and delamination were carried out according to Example II resulting in excellent image qualities.

EXAMPLE IV

A photopolymerizable composition was prepared with the following ingredients:

| | Grams |
|---|---|
| Colloidal aluminum oxide | 6.7 |
| Bentonite | 13.3 |
| Trimethylolpropane ethylene oxide triacrylate adduct | 50.0 |
| 2-Ethylanthraquinone | 2.5 |
| p-Methoxyphenol | 1.0 |
| Rhodamine pigment (CI No. 45160) | 10.6 |
| Water | 44.0 |
| Ethanol | 470.0 |

This mixture was milled for 16 hours and coated as in Example I. Then a clear sheet of polyethylene terephthalate was laminated to the exposed surface of the photopolymer layer. The optical density was 0.4 at 3500A. Image exposure was carried out with a carbon arc through a processed negative on the polyethylene terephthalate side of the element. The exposed photographic element was delaminated and the unpolymerized material adhered to the polypropylene support while the polymerized material adhered to the cover sheet. The unpolymerized material was transferred to a receptor paper by laminating the receptor paper to the unpolymerized material and applying 5000 psi pressure by a conventional static pressure. The resulting image on the receptor paper was of a high quality.

EXAMPLE V

A photopolymerizable coating composition was prepared from the following ingredients:

| | Grams |
|---|---|
| Colloidal aluminum oxide | 5.8 |
| Bentonite clay | 18.7 |
| Trimethylolpropane ethylene oxide triacrylate adduct | 55.0 |
| 2-Ethylanthraquinone | 2.4 |
| p-Methoxyphenol | 1.2 |
| Phthalocyanine blue pigment (CT 74160) | 13.0 |
| Water | 48.0 |
| Ethanol | 350.0 |

The mixture was milled for 16 hours in the manner described in Example I then reversed roll coated onto a 1-ml. polyethylene terephthalate film base to a dry coating thickness of 0.1-ml. The optical density was 0.6 at 3500A. Many samples were made using various materials for a cover sheet. The first sample was a control sample using polyethylene terephthalate as the cover sheet producing a symmetrical element. After repeated prolonged exposure according to the manner described in Example I the symmetrical element was delaminated and no image separation occurred.

After the control sample displayed that two supports having like chemical affinity for the photopolymer layer would not produce image separation, other cover sheets were tried which had a higher degree of chemical affinity for the photopolymer than the support. The various cover sheets tried were commercial paper, paper coated with a gelatin coating, a plastic film coated with a resin copolymer, a plastic film coated with an unpolymerized photopolymer coating and paper coated with an acrylic polyester resin. In each of these samples imagewise exposure was made according to the manner described in Example I, the element was then delaminated and image separation occurred. The polymerized material in each case adhered to the cover sheet and the unpolymerized material adhered to the polyethylene terephthalate support. The resulting image quality in each instance was excellent. The unpolymerized material remaining on the polyethylene terephthalate support was then capable of being laminated to a receptor, pressure applied and the unpolymerized image transferred to the receptor upon delamination of the polyethylene terephthalate support.

EXAMPLE VI

A photopolymerizable composition was prepared from the following components:

| | Grams |
|---|---|
| Microcrystalline cellulose | 3.0 |
| Sodium salt of polymerized alkyl naphthalene and sulfonic acid | 0.4 |
| p-Methoxyphenol | 0.2 |
| 2-Ethylanthraquinone | 0.7 |
| Trimethylolpropane ethylene | |

| | |
|---|---|
| oxide triacrylate adduct | 10.0 |
| Isopropanol | 8.0 |
| Water | 46.0 |
| Saponin | 2.0 |
| Phthalocyanine blue pigment CI 74160 | 0.8 |
| Isooctyl phenylpolyethoxy ethanol | 1 |

The above formulation was thoroughly mixed by ball milling for 16 hours and then coating the resulting solution on a 1-mil polypropylene sheet by skim coating. After drying, a 2-mil aluminized polyethylene terephthalate cover sheet was laminated to the exposed surface of the photopolymerizable layer. Exposure was carried out through a process positive from the polypropylene side of the photographic element. Upon delamination of the film element the unpolymerized positive image remained on the polypropylene base while the polymerized image adhered to the metalized cover sheet. The unpolymerized image remaining on the base was laminated to a receptor paper and the resultant element placed in a static press where pressure approx. 5,000 psi was applied. After removal of the pressure and delamination of the polypropylene base an image of excellent quality had been transferred to receptor paper.

EXAMPLE VII

A photopolymerizable composition was prepared and coated onto a 1-mil polypropylene film base in the manner described in Example I. A 20-mil thick grained aluminum plate was laminated to the expose photopolymer layer. After image-wise exposure through the polypropylene support the element was delaminated resulting in image separation. The polymerized areas adhered to the aluminum plate while the unpolymerized material adhered to the polypropylene support. The image quality was excellent. The polymerized material on the metal plate may now be use as a printing litho plate while the unpolymerized material remaining on the film support may be transferred to a receptor by laminating a receptor to the unexposed photopolymer layer applying pressure then delaminating the polypropylene support.

EXAMPLE VIII

A set of separation positives was used to make a four-color surprint on paper, in the following manner. A composition was prepared and coated according to the manner described in Example I. Exposure was made through a yellow positive and the element was delaminated. The soft positive yellow image was transferred to a smooth cast coated offset paper by laminating it to the paper subjecting the sandwich to pressure obtained by the impact of metal balls carried out for 4 minutes in the apparatus described in Halpern U.S. Pat. No. 3,244,777. The same procedure was carried out using the magenta matrix described in Example IV and the cyan matrix of Example V. A black image was obtained by preparing the composition of Example I, only a black carbon pigment dispersed in isopropanol was used instead of the yellow pigment. All four color separation images were transferred in registered superposition onto the paper to produce a four-color surprint equivalent to a press copy of the same set of separations.

The order of color image lay down is arbitrary so any combination of image colors can be prepared on paper. The resulting four color image could be hardened if desired by postexposing it.

EXAMPLE IX

The following polymerizable composition was prepared:

| | Grams |
|---|---|
| Silicon dioxide (processed under high temperature to treat the surface to make it less thixotropic) | 2.0 |
| Trimethylolpropane ethylene oxide triacrylate adduct | 5.9 |
| 2-Ethylanthraquinone | 0.13 |
| p-Methoxyphenol | 0.13 |
| Sodium salt of polymerized alkyl naphthalene sulfonic acid | .21 |
| Silicon dioxide | .23 |
| Benzidine yellow pigment (CI 21090) | .80 |
| Water | 39.0 |
| Isopropanol | 2.0 ml. |
| Saponin | 0.6 |

This mixture was ball milled for 16 hours then coated by air knife on a 1-mil biaxially oriented polypropylene sheet. After drying a 2-mil polyethylene terephthalate plastic was laminated to the exposed coating surface. A carbon arc exposure was made from the polypropylene side of the photographic element through a process positive. The element was then delaminated with an unpolymerized image remaining on the polypropylene and a complementary polymerized negative image adhering to the cover sheet. A receptive paper was laminated to the unpolymerized image and pressure applied to the film element by passing it through pressure rolls at 6 feet per minute. The polypropylene was delaminated from the receptor paper and a clear, high fidelity image remains on the receptor paper.

EXAMPLE X

The following polymerizable composition was prepared:

| | |
|---|---|
| Barium sulfate | 12.0 g. |
| Trimethylolpropane ethylene oxide triacrylate adduct | 5.9 g. |
| 2-Ethylanthraquinone | 0.18 g. |
| p-Methoxyphenol | 0.12 g. |
| Sodium salts of polymerized alkyl napthalene and sulfonic acid | 0.21 g. |
| Silicon dioxide (treated with organic alcohol) | 0.23 g. |
| Rhodamine toner (CI 45160) | 0.8 g. |
| Water | 39.0 g. |
| Isopropanol | 2.0 ml. |
| Saponin | 0.6 ml. |

This composition was thoroughly mixed by milling then coated on a 0.8 mil biaxially oriented polypropylene base by reverse roll coating. A 1 mil polyethylene terephthalate cover sheet was laminated to the surface of the polymerizable layer. Exposure, delamination, and image transfer of the unpolymerized material was accomplished according to the procedure of Example I. The fidelity of the image transferred to the receptor paper was excellent.

EXAMPLE XI

A photopolymerizable composition was prepared from the following ingredients:

| | Grams |
|---|---|
| Kaolinite (Phillips Minerals and Chemical Company) | 2.0 |
| Trimethylolpropane ethylene oxide triacrylate adduct | 5.5 |

| | |
|---|---|
| Sodium salts of polymerized alkyl naphthalene sulfonic acid | 0.2 |
| Rhodamine toner (CI 45160) | 0.5 |
| 2-Ethylanthraquinone | 0.1 |
| Methyl ether hydroquinone | 0.1 |
| Water | 40.0 |
| Isopropanol | 4.0 ml. |
| Saponin | 0.1 |

These materials were placed in ½-gallon porcelain ball mill and ball milled for 16 hours to form a uniform dispersion. This dispersion was then coated onto 0.8-mil polypropylene base by reverse roll coating to a dry thickness of 0.1-mil. After drying, a polyethylene terephthalate clear cover sheet was laminated to the surface of the unpolymerized material. Exposure, image separation by delamination, and transfer by pressure to a paper cover sheet resulted in an image of excellent quality.

EXAMPLE XII

Example IV was repeated without the Rhodamine pigment being present and similar results were obtained.

In place of the specific initiators described in the foregoing Examples and description there may be substituted, in amounts from 0.01 to 20.0 percent by weight of the total solids in the composition, one or more other free radical photoinitiators.

Suitable free-radical photoinitiators are those described in Plambeck U.S. Pat. No. 2,760,863, Aug. 28, 1956, Notley, U.S. Pat. No. 2,951,758, Sept. 6, 1960, and any of the photoreducible dyes and reducing agents listed in Oster, U.S. Pat. Nos. 2,850,445; 2,875,047; 3,097,096; and Oster et al., U.S. Pat. Nos. 3,074,794; 3,097,097 and 3,145,104. Depending on the initiating system employed, a single component may be used such as the polynuclear quinones or a polynuclear quinone and another initiator such as Michler's ketone may be used, or a multicompound system such as a photoreducible dye and a free-radical producing agent.

The processes of the present invention are particularly useful in color proofing. For example, three thermoplastic photopolymerizable compositions can be prepared each containing a different colorant. Each photographic element is then exposed to a halftone, 3-color separation positive type photographic process image. After exposure, the elements are delaminated and the unpolymerized material transferred in registered superposition to a common receptor paper. In this manner a well defined high contrast multicolor reproduction of the original image may be formed. This invention is also useable in surprinting, the making of decalcomanias, tilting films and making transparent slides. Because the polymerized images which are formed are quite resistant to chemical or solvent attack this invention may be used in making lithographic-offset printing and photo-resist elements.

The embodiments of the invention in which an exclusive property or privilege is claimed are defined as follows:

1. A photopolymerizable element comprising a laminated element having a solid photopolymerizable stratum intercalated between two sheet supports, said photopolymerizable layer a. having a thickness of at least 0.05 mil;

b. containing a liquid, ethylenically unsaturated monomer with at least one terminal ethylenic group and being capable of forming a high polymer by free radical initiated, chain-propagated addition polymerization and an addition polymerization initiator activatable by actinic light;

c. having an optical density to actinic radiation of not more than 0.6;

d. and containing at least one particulate thickener material having discrete and orderly orientation, selected from the group consisting of silicas, clays, alumina, bentonites, kaolinites, attapulgites and montmorillonites, and microcrystalline celluloses;

the monomer being present in the amount of 10–90 parts of monomer per 100 parts, by weight, of monomer-thickener composition, the supports having different chemical affinities, whereupon upon exposure polymerized material adheres to the support having the higher chemical affinity for the photopolymerized material, the unpolymerized material adhering to the support having the lower chemical affinity for said material.

2. An element according to claim 1, wherein said supports are flexible macromolecular organic polymer films.

3. An element according to claim 1, wherein one support is a polyolefin of 2–3 carbons and the other is a polyester having a vinylidene chloride addition copolymer layer contiguous with the photopolymerizable layer.

4. An element according to claim 1, wherein one support is polypropylene and the other is an aluminized polyethylene terephthalate film, the aluminum surface being in contact with the layer.

5. An element according to claim 1, wherein the monomer is a polyoxyethyltrimethylolpropane triacrylate or trimethacrylate of average molecular weight 450–40,000.

6. An element according to claim 1, wherein the monomer is a polyoxyethylpentaerythritol tetraacrylate or tetramethacrylate of 450–40,000 molecular weight.

7. An element according to claim 1, wherein the monomer is a polyoxyethyltrimethylolpropane triacrylate or trimethylacrylate of average molecular weight 450–40,000, and the initiator is 2-ethylanthraquinone.

8. An element according to claim 1, wherein the monomer is a polyoxyethylpentaerythritol tetraacrylate or tetramethacrylate of 450–40,000 molecular weight, and the initiator is 2-ethylanthraquinone.

9. An element according to claim 1, wherein the layer contains a colored pigment.

10. An element according to claim 1, said element being delaminatable after imagewise exposure to yield a negative image of unpolymerized material on the support through which exposure was made and a positive image of polymerized material on the other support.

* * * * *